US005256920A

United States Patent [19]

Porzio

[11] Patent Number: 5,256,920

[45] Date of Patent: Oct. 26, 1993

[54] ACOUSTIC TRANSDUCER

[75] Inventor: Raymond Porzio, Amherst, N.H.

[73] Assignee: Lockheed Sanders, Inc., Nashua, N.H.

[21] Appl. No.: 633,729

[22] Filed: Dec. 21, 1990

[51] Int. Cl.[5] .................... H02K 41/02; H01L 41/09; H02N 02/00; H04R 11/14

[52] U.S. Cl. .................... 310/13; 310/334; 367/174; 367/185

[58] Field of Search .................... 310/12, 13, 15, 17, 310/26, 27, 36, 322, 323, 328, 334, 369, 339, 317, 370, 254; 367/153, 163, 175, 174, 178, 185

[56] References Cited

U.S. PATENT DOCUMENTS

| | | | |
|---|---|---|---|
| 2,812,452 | 11/1957 | Harris | 367/157 |
| 2,920,307 | 1/1960 | Chernosky | 340/17 |
| 3,230,504 | 1/1966 | Horan et al. | 340/10 |
| 3,274,537 | 9/1966 | Toulis | 340/8 |
| 3,277,433 | 10/1966 | Toulis | 340/8 |
| 3,484,630 | 12/1969 | Schwartz | 310/26 |
| 4,219,095 | 8/1980 | Trouiller | 181/104 |
| 4,220,887 | 9/1980 | Kompanek | 310/334 |
| 4,384,351 | 5/1983 | Pagliarini, Jr. et al. | 367/175 |
| 4,651,044 | 3/1987 | Kompanek | 310/323 |
| 4,679,178 | 7/1987 | Larson et al. | 367/157 |
| 4,706,230 | 11/1987 | Inoue et al. | 367/174 |
| 4,754,441 | 6/1988 | Butler | 367/157 |
| 4,857,791 | 8/1989 | Uchino et al. | 310/321 |
| 4,901,293 | 2/1990 | Kuhn | 367/168 |

*Primary Examiner*—Steven L. Stephan
*Assistant Examiner*—D. R. Haszko
*Attorney, Agent, or Firm*—David W. Gomes

[57] ABSTRACT

An acoustic transducer provides an elongated outer shell made of magnetic material and having a pair of flexural members attached to each other in the elongated direction and having a flexural portion extending normally to the elongated direction and forming a partial enclosure between the two flexural portions, and a magnetic drive located within the partial enclosure and engaging the flexural portions for causing the portions to oscillate flexurally.

21 Claims, 5 Drawing Sheets

ACOUSTIC TRANSDUCER

BACKGROUND OF THE INVENTION

1. Field of the Invention

This invention generally relates to acoustic transducers for converting energy between electricity and sound and, in particular, to such transducers which use electromagnetism.

2. Statement of the Prior Art

Electromagnetic acoustic transducers are very common and have been widely used in perhaps all applications of acoustic transducers from audio reproduction to seismic mapping, to underwater detection, etc.. Generally, the use of electromagnetic versus piezoelectric transducers and the design parameters in any application are strongly application dependent and responsive to such considerations as desired frequency range, power level and operating environment. For this reason, transducers of various sizes, shapes and configurations have been developed for these various applications. Among the existing transducers are flexural and flextensional transducers. Such transducers are represented by U.S. Pat. Nos. 2,812,452; 2,920,307; 4,384,351; and 4,651,044.

U S. Pat. No. 2,812,452 is perhaps one of the earliest transducers using a slotted cylinder vibrating in the flexural mode. The slot runs longitudinally along the cylinder which is attached to a support along the portion of the cylinder diametrically opposed to the slot. In this manner, the halves of the cylinder on each side of the slot vibrate flexurally when driven by a piezoelectric material bonded to the inside of the metal cylinder. The patent boasts of a favorable power to weight ratio and may be coated with plastic or rubber for underwater use.

U.S. Pat. No. 2,920,307 provides a variable reluctance seismometer. The seismometer does not use an external carrier current and is sensitive to pressure or squeezing action as distinguished from displacement, velocity, or acceleration. The seismometer makes use of various cylindrical arrangements, employing a permanent magnet to establish a magnetic field in the cylinder and across an air gap. The air gap is formed as one or more longitudinal slots in the cylinder. A coil is magnetically coupled to the magnetic field of the permanent magnet to sense variations caused by changes in the thickness of the narrow air gap.

U.S. Pat. No. 4,384,351 discloses an electromagnetically driven flextensional transducer especially designed for use at greater water depths. A tubular shell having an oval cross-section is used with an electromagnetic element aligned with either the major or minor axis of the oval. The shell does not have to be pressure neutralized for greater depths because depth distortion does not impede the performance of the electromagnetic drive in the same manner as it would impede a piezoelectric drive.

U.S. Pat. No. 4,651,044 discloses a cylindrical piezoelectrically driven transducer operating in the flexural mode. The piezoelectric materials are cylindrically formed and bonded to the inside of the cylinder. In another form, the piezoelectric driver is mounted diametrically across the cylinder and orthogonally to the slot.

It is against this background that performance improvements are still desired for acoustic transducers in the power output below the frequency of 400 Hertz.

SUMMARY OF THE INVENTION

Accordingly, it is an object of the present invention to provide an acoustic transducer having a low frequency power output which is greater than that which is available from existing devices for the same approximate size, weight and cost. An acoustic transducer provides an elongated outer shell made of magnetic material and having a single slot directed in the elongated direction thereof for allowing the shell to oscillate flexurally from a portion of the shell generally opposite the slot. The transducer also includes permanent magnet means located within the shell for forming a static magnetic field which passes through the outer shell and normal to the elongated direction thereof, and field coil means, located within the shell, for introducing alternating magnetic flux into the magnetic field of the permanent magnet means for causing the outer shell to oscillate flexurally. In refined versions, the transducer has either a circular or U-shaped cross-section.

An alternate version of the present invention includes an elongated outer shell made of magnetic material and having a U-shaped cross-section normal to the elongated direction with opposed sides and a closed end for allowing the opposed sides to oscillate flexurally from the closed end and magnetic drive means located within the shell and engaging the opposed sides for causing the sides to oscillate flexurally. A refined version includes a second outer shell substantially identical to the first said outer shell and having an open end which is located to oppose and substantially close a substantially identical open end of the first said shell forming a pair of opposing slots in the elongated direction of the transducer and second magnetic drive means located within the second shell and engaging the opposed sides thereof for causing the opposed sides to oscillate flexurally. This refined version may optionally include a flexible covering effectively closing the opposing slots formed between the first and second outer shells or a support means extending between the closed ends of the U-shaped cross-sections of the opposed outer shells for effectively preventing vibrational modes other than a first vibrational mode from forming in the shells.

Another alternate version of the present invention is an acoustic transducer providing an elongated outer shell made of magnetic material and having a pair of flexural members attached to each other in the elongated direction and having a flexural portion extending normally to the elongated direction and forming a partial enclosure between the two flexural portions, and magnetic drive means located within the partial enclosure and engaging the flexural portions for causing the portions to oscillate flexurally. A refinement includes the outer shell having a U-shaped cross-section normal to the elongated direction with opposed sides forming the flexural members and a closed end forming the attachment of the two flexural members.

BRIEF DESCRIPTION OF THE DRAWINGS

The present invention is illustratively described in reference t the accompanying drawings of which.

DETAILED DESCRIPTION OF THE DRAWINGS

Figure 1:
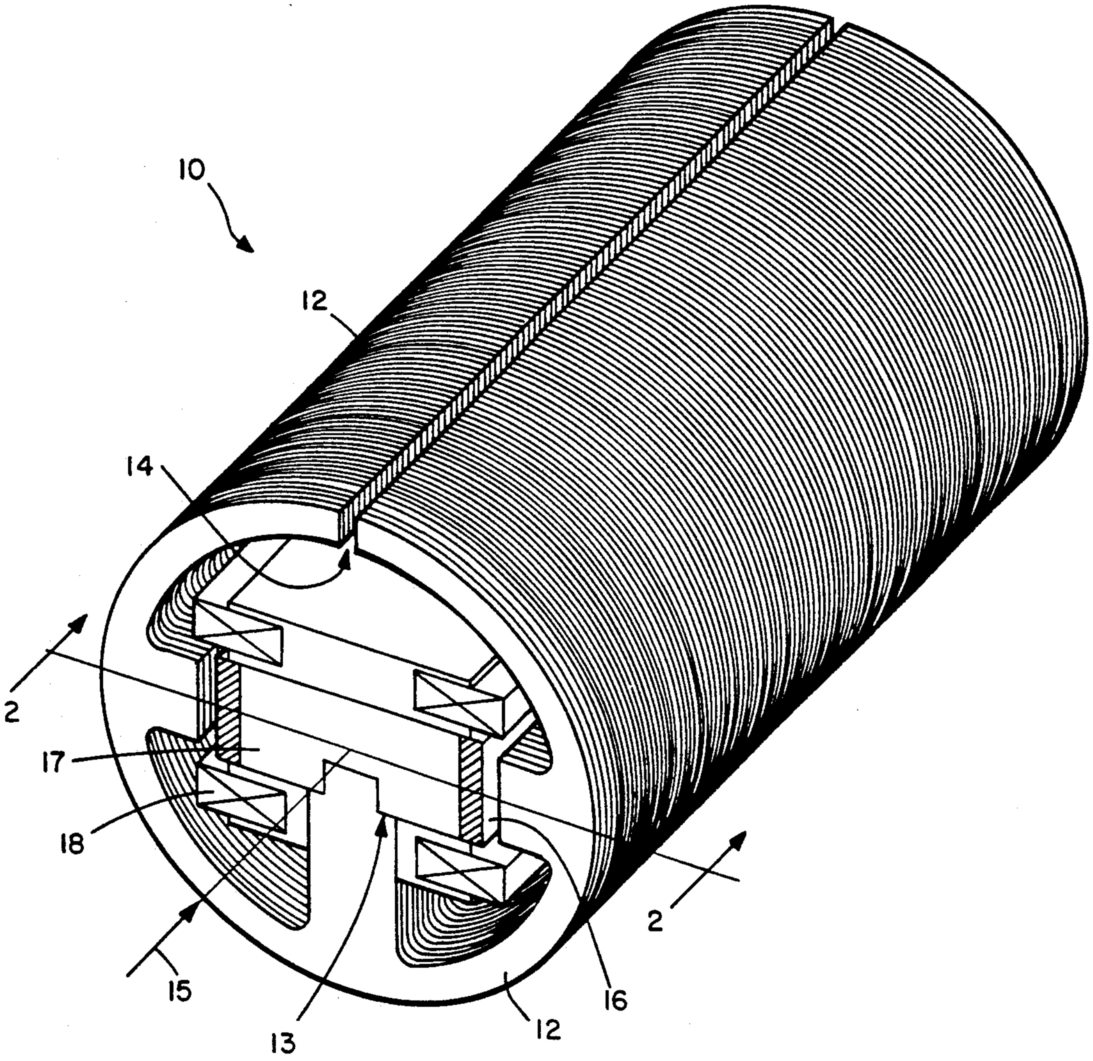
FIG. 1 is a perspective view of an acoustic transducer constructed in accordance with one embodiment of the present invention.
Figure 2:
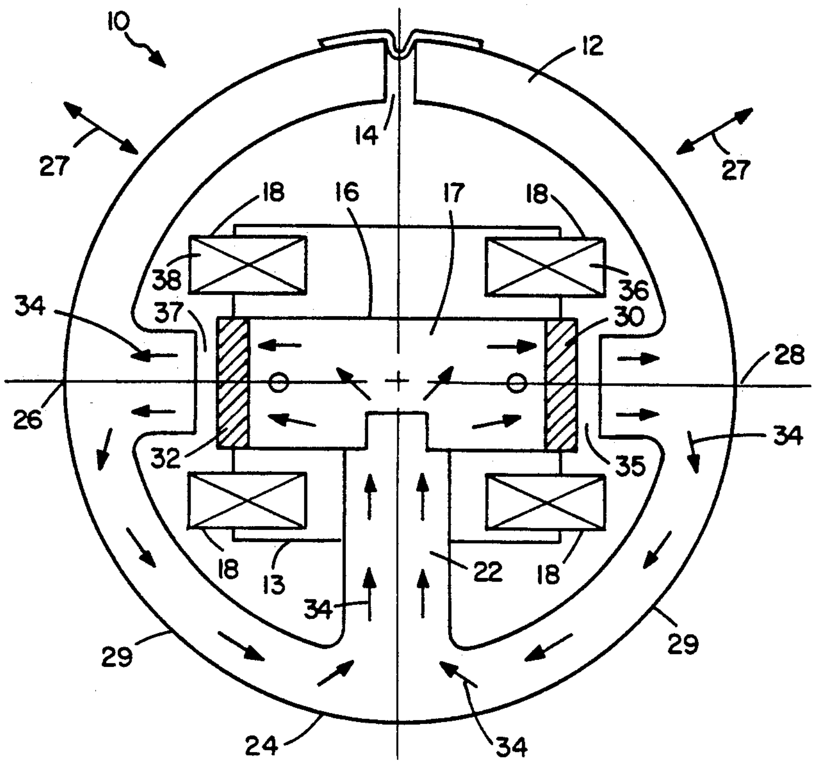
FIG. 2 is an end view of the embodiment of FIG. 1 taken along view lines 2—2.

An acoustic transducer 10 is shown in FIGS. 1 and 2 including an elongated outer shell 12 and an internally mounted magnetic drive means 13. The outer shell 12 includes a slot 14 passing therethrough and running in the elongated direction of the shell indicated by arrow 15. In the present embodiment, the shell 12 is cylindrical and slot 14 is parallel to the cylindrical axis 15; however, shell 12 may take one or more other shapes as described below. The shell 12 is made of magnetic material and is laminated in the direction of its axis 15 for reducing undesirable eddy currents in all planes orthogonal to the intended magnetic flux paths.

Included in the magnetic drive means 13 are a permanent magnet means 16 and field coil means 18, magnetically coupled thereto. The permanent magnet means 16 includes a pole piece 17 and permanent magnets 30,32 affixed to the ends thereof. Pole piece 17 is laminated in the same manner and for the same reasons as the shell 12. Permanent magnet means 16 is mounted to shell 12 by means of a support member 22 affixed to the pole piece 17. Support member 22 is made of magnetic material and may be considered to be part of permanent magnet means 16. Support member 22 is affixed to the inside of shell 12 at a portion thereof which is generally opposite to the location of slot 14. In the cylindrical embodiment shown, the support member 22 is affixed diametrically opposite slot 14 and is constructed as part of the laminated sections of shell 12. Magnet drive means 13 extends in the elongated direction of the shell 12 for substantially the same distance as slot 14.

Permanent magnet means 16 is shown to extend from one angular location 26 within shell 12 to another angular location 28 thereof. In this manner, a static or polarizing magnetic field is created which passes through the outer shell and normal to the elongated direction thereof. The static magnetic field passes through portions 29 of the shell 12 away from the slot 14.

FIG. 2 further shows the permanent magnets 30,32 forming a pair of static or polarizing magnetic fields indicated by the arrows 34, which fields pass separately through the outer shell on separate sides of support member 22 and normal to the elongated direction of transducer 10. The magnetic fields return through the shell 12 to support member 22 and collectively back to permanent magnet means 16.

To complement this arrangement, field coil means 18 are shown as a plurality of field coils 36,38 each of which is magnetically coupled to the field of a separate permanent magnet 30,32. Field coils 36,38 are used to vary the static fields for causing the outer shell to oscillate flexurally in the direction of arrows 27. It is intended that the transducer 10 oscillate flexurally from or about the portion 24. The fundamental mode of vibration is the first even bending mode which results in a vibrational node, a point of no motion, approximately located at portion 24. Flexural waves are produced from this portion which propagate about the entire shell.

As shown, the permanent magnet means 16 extends into close proximity with shell 12 forming a pair of air gaps 36,37 therebetween. Both permanent magnets 30,32 and field coils 36,38 are located at the air gaps 36,37 for the purpose of maintaining the polarizing magnetic fields as uniform as possible as the fields cross the air gaps 36,37

Also shown in FIG. 2 is a seal 39 for slot 14, to allow transducer 10 to be used in water. The seal 39 may be constructed in any suitable manner to allow free vibration of the shell 12. It is preferably made of flexible material such as rubber and may be partial, covering only slot 14, or may completely encapsulate the shell 12.

The shell 12 and support member 22 may be made of any suitable magnetic material such as high permeability silicon iron or vanadium permendur. Permanent magnets 30,32 may be made of any suitable rare earth alloy such as samarium cobalt, having high intrinsic coercivity.

In operation, permanent magnets 30,32 maintain static magnetic fields which cross the air gaps 36,37 into separate portions 26,28 of shell 12, return to support member 22 in directions normal to the elongated direction of shell 12, and return collectively to magnet means 16 through support member 22 thereby polarizing the magnetic circuit. Field coils 36,38 couple with these magnetic fields and receive an alternating current which alternately reverses and strengthens the otherwise static fields. The change in the magnetic fields causes shell 12 to oscillate flexurally at the frequency of the alternating current.

Figure 3:
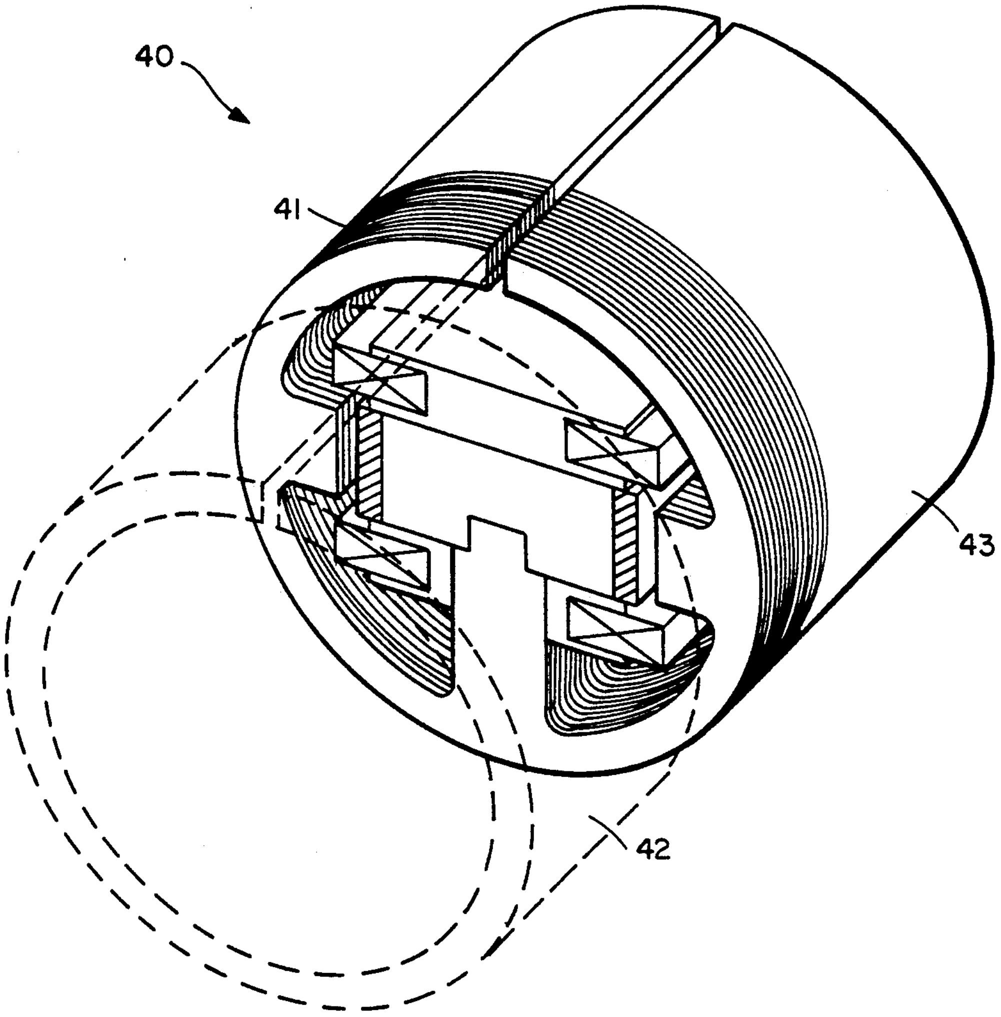
FIG. 3 is a perspective view of an acoustic transducer constructed in accordance with a variation of the embodiment of FIG. 1.

FIG. 3 shows a more complete transducer 40, partially in phanton, having an active midsection 41 and a pair of passive end sections 42,43. The active midsection 41 is constructed in the same manner as the embodiment of FIGS. 1 and 2 and is further coupled to end sections 42,43 for the purpose of extending the effective radiating area of the transducer. End sections 42,43 increase the stiffness of the midsection 41 which stiffness affects the operating frequency of the transducer. End sections 42,43 have the same geometry as midsection 41 and may be made of any suitable semi-flexible material such as aluminum or fiberglass.

Figure 5:
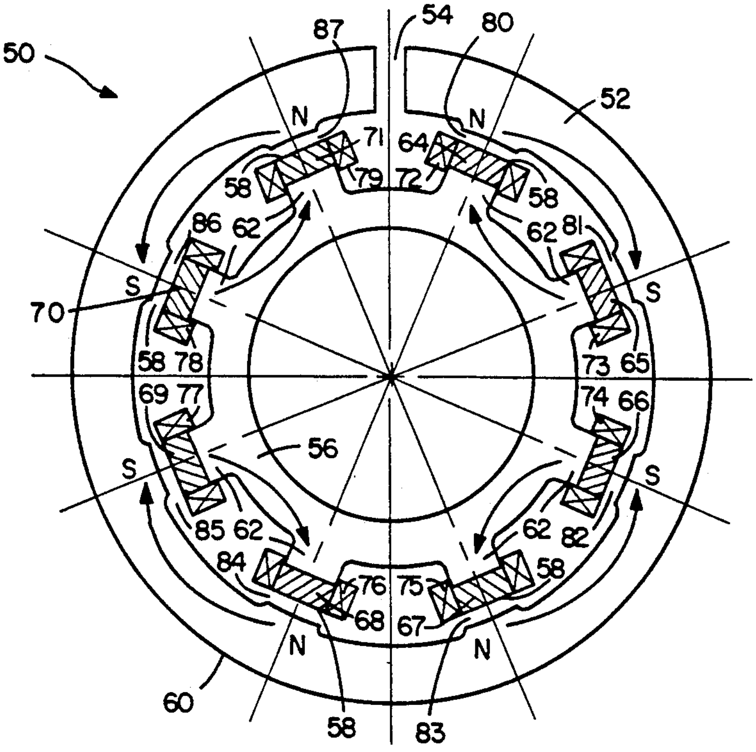
FIG. 5 is an end view of the embodiment of FIG. 4 taken along view lines 5—5.
Figure 4:
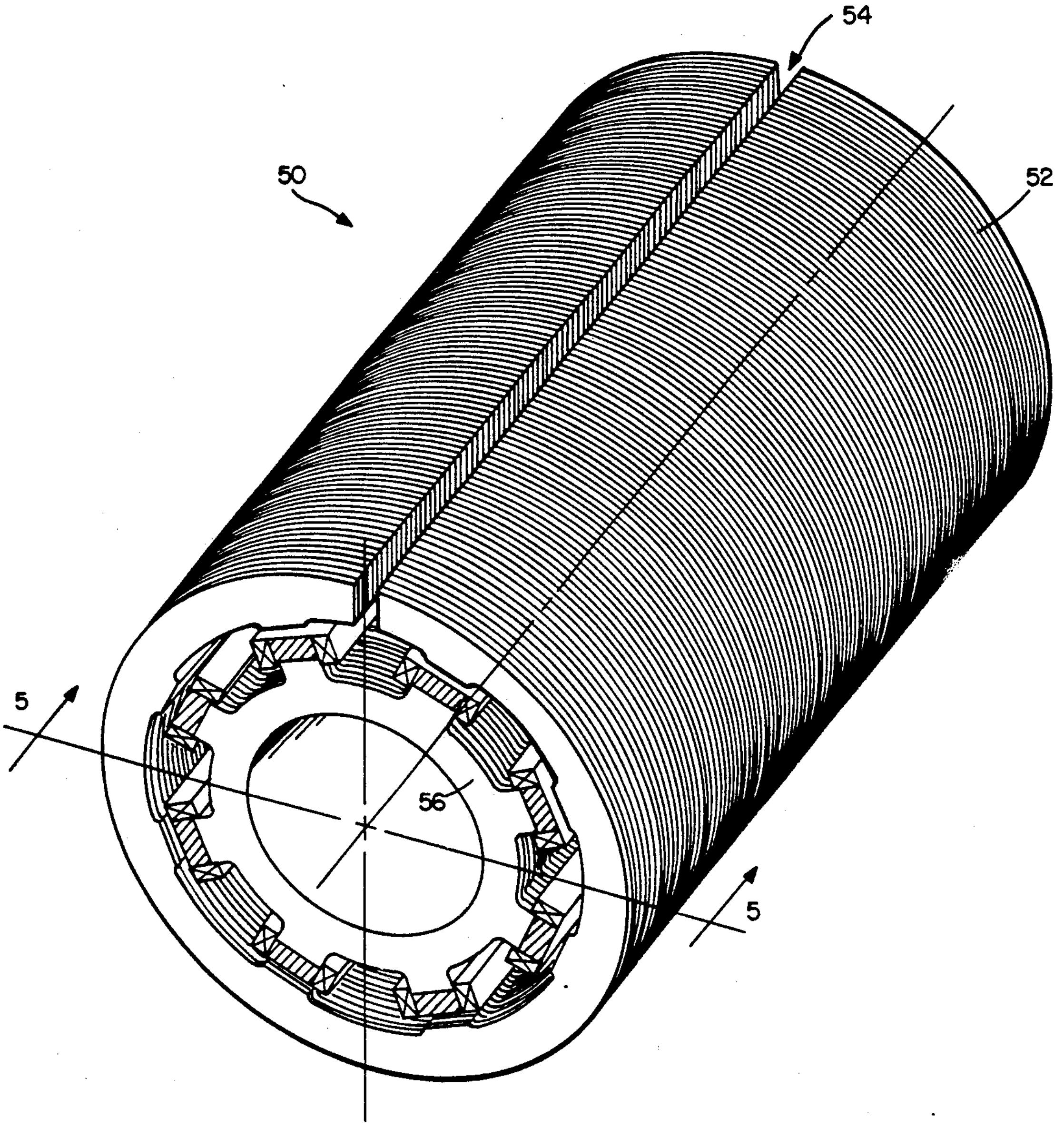
FIG. 4 is a perspective view of an acoustic transducer constructed in accordance with another embodiment of the present invention.

FIG. 4 shows a perspective view of another embodiment of the present invention including a transducer 50 having a shell 52 with a slot 54. A centrally located support member 56 is integrated with a plurality of permanent magnet means 58 for magnetically engaging each half of shell 52. The magnetic circuits are shown in greater detail in FIG. 5 which is an end view of the transducer 50 of FIG. 4 taken from view line 5—5.

Support member 56 is made of magnetic material and is constructed in cylindrical form. It is located concentrically within the shell 52 and may be attached thereto by any suitable means (not shown), preferably at or along the portion 60 of the shell 52 located diametrically opposite slot 54. Support member 56 includes a plurality of protrusions 62 angularly located around the circular cross-section. Protrusions 62 are arranged in pairs so that each pair forms a separate magnetic flux circuit between support member 56 and shell 52. This arrangement is not required, of course, as a single protrusion could act as the coupling for a pair of magnetic circuits in a manner similar to that shown in FIGS. 1-3.

Each of the protrusions 62 extends radially outward into proximity with the shell 52 to form a magnetic coupling therewith. A permanent magnet 64-71 is located at the end of each protrusion for providing a static magnetic field to the respective magnetic circuit. The directions N,S of the magnetic poles of magnets 64-71 are arranged to provide a complete magnetic circuit between the paired protrusions 62.

Each permanent magnet 64-71 also has associated therewith a field coil 72-79, respectively, for causing alternation of the respective static magnetic fields. Both permanent magnets 64-71 and field coils 72-79 are separated from shell 52 by air gaps 80-87, respectively, to allow flexural vibration of shell 52. Each of the permanent magnets 64-71 extends for the length of the active laminated portion 88 of shell 52. In larger embodiments, the permanent magnets and field coils may be sectioned in the elongated direction to improve ease of construction.

In operation, transducer 50 functions in the same manner as transducer 10 of FIG. 1. The permanent magnets form static magnetic fields which cross the air gaps into the shell and pass through the shell in directions normal to the shell's elongated direction. The field coils alternately reverse these static fields causing the shell to be alternately attracted to and repulsed from the permanent magnets. This shell movement generates acoustic energy at the frequency of the shell vibration.

Figure 6:
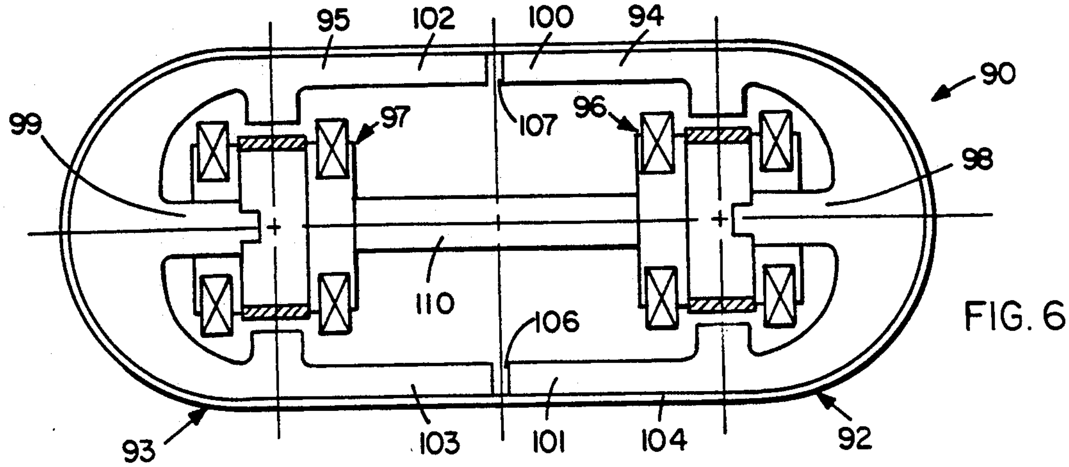
FIG. 6 is a sectional view of an acoustic transducer constructed in accordance with yet another embodiment of the present invention.
Figure 7:
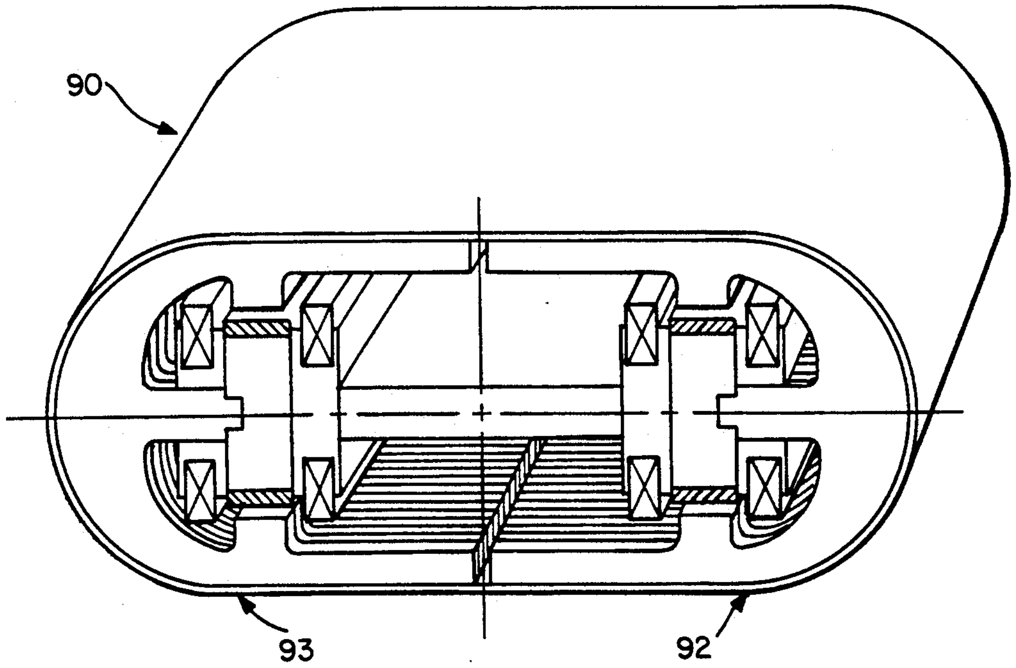
FIG. 7 is a perspective view of the embodiment of FIG. 6.

FIG. 6 shows a cross-section of a transducer 90 constructed in accordance with yet another embodiment of the present invention. The overall transducer 90 is made up of a pair of individual transducers 92,93 which are configured to be mechanically and functionally coupled together. Each of the transducers 92,93 is constructed in a manner similar to the previously described embodiments including an outer shell 94,95 and an internally mounted magnetic drive means 96,97. Transducers 92,93 are similarly constructed to form a polarizing or static magnetic field which passes from the magnetic drive means 96, through the outer shell in directions parallel to the plane of the cross-section shown and back to the magnetic drive means through a support member 98,99 constructed integrally with the shell 94,95. The individual transducers 92,93 are intended to be elongated in the direction normal to the plane of the cross-section as shown in FIG. 7. The transducers 92,93 are similarly laminated in the elongated direction to prevent undesirable eddy currents. Transducers 92,93 also vibrate in the same flexural mode previously described.

Transducers 92,93 vary from prior embodiments in that their respective shells 94,95 are not individually enclosing except for a limited slot. Instead, transducers 92,93 are formed having a U-shaped cross-section which causes the slot 14 of FIG. 1 to take the form of the open end of the U-shape. Also, the closed end of each U-shape is thickened to better withstand flexural stress.

The two transducers are then configured in combination so that their respective "wide slots" mate with or oppose each other forming a substantial enclosure. In this manner the sides of the U-shaped cross-section of each transducer form opposed flexural members 100-103 with the magnetic drive means 96,97 located therebetween. The magnetic drive means 96,97 engage the opposed sides 100-103 in the same manner as described for the previous embodiments and cause the opposed sides 100-103 to oscillate flexurally from the closed ends of the U-shaped cross-section.

With the individual transducers 92,93 so configured, the overall transducer 90 is enclosed in a flexible material 104, such as rubber, which closes the remaining opposing gaps 106,107 between the individual transducers 92,93 while still allowing vibration of the flexural shell members 100,101,102,103.

Each of the individual transducers 92,93 may be said to have a pair of flexural members, represented by each half of the U-shape, which members are attached to each other in the elongated direction and have a flexural portion 101-103 extending normally to the elongated direction and forming a partial enclosure between the two flexural portions. The magnetic drive means 96,97 may then be said to be located within the partial enclosure, engaging the flexural portions for causing flexural oscillation.

In operation, the individual transducers 92,93 are electrically excited in phase so that the paired flexural shell members 100,102 and 101,103 are caused to vibrate in the same direction. This manner of operation reduces shear stress forces and associated mechanical losses on the enclosing rubber coating 104. In addition, the U-shaped cross-section provides a symmetric near-field pressure distribution to the output acoustic signal.

The performance of the overall transducer 90 may be further enhanced by affixing each of the individual transducers to a center support member 110. Support member 110 insures that a virtual node is provided at the vibrational center of each individual transducer 92,93. This prevents parasitic vibrational modes besides the first vibrational mode from forming in the shells 94,95. Support member 110 may be constructed in any suitable manner using either magnetic or non-magnetic material such as aluminum. If magnetic material is used, it should be laminated in the same manner as the shell 94,95.

Although the individual transducers 92,93 are shown in a paired arrangement each is capable of operating separately depending upon environmental and design criteria.

The physical dimensions and particular materials used for all of the above embodiments depend upon the frequency and power specifications of each application and may be calculated and measured in accordance with well known engineering principles.

CONCLUSION

The present invention provides an improved acoustic transducer which has enhanced power and weight efficiency. The construction makes efficient use of material by using the radiating shell and internal support members as parts of the magnetic circuit. This construction also provides a greater displacement of the radiating surface than existing ceramic devices which enables enhanced low frequency performance.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. An acoustic transducer, comprising:

an elongated outer shell made of magnetic material and having a slot directed in the elongated direction thereof for allowing the shell to oscillate flexurally from a portion of the shell generally opposite the slot;

permanent magnet means, located within the shell, for forming a static magnetic field which passes through the outer shell and normal to the elongated direction thereof; and field coil means, located within the shell, for introducing alternating magnetic flux into the static magnetic field of the permanent magnet means for causing the outer shell to oscillate flexurally.

2. The acoustic transducer of claim 1, wherein portions of the outer shell away from the slot are adapted to carry the static magnetic field.

3. The acoustic transducer of claim 2, wherein the permanent magnet means forms a plurality of static magnetic fields which pass separately through the outer shell and normal to the elongated direction thereof, and the field coil means includes a plurality of field coils each of which is magnetically coupled to one of each of said plurality of static magnetic fields.

4. The acoustic transducer of claim 3, further comprising a support member made of magnetic material and affixed to the inside portion of the shell generally opposite to the slot, and wherein the permanent magnet means is mounted on the support member.

5. The acoustic transducer of claim 4, wherein the permanent magnet means extends from the support member into proximity with the outer shell on both sides of the support member and includes a pair of permanent magnets for forming a pair of static magnetic fields which pass collectively through the support member, individually through separate portions of the outer shell on separate sides of the support member and normal to the elongated direction of the transducer, and back through the outer shell to the support member.

6. The acoustic transducer of claim 5, wherein each permanent magnet is located in proximity with the outer shell, and further wherein an air gap is formed between each permanent magnet and the outer shell, which gaps vary in size with flexing of the shell during oscillation.

7. The acoustic transducer of claim 6, wherein the field coils are each located in proximity to a separate air gap.

8. The acoustic transducer of claim 7, wherein the elongated shell is cylindrical.

9. The acoustic transducer of claim 7, wherein the elongated shell has a U-shaped cross-section.

10. The acoustic transducer of claim 9, wherein the support member is affixed to the inside of the shell along the closed end of the U-shaped cross-section and opposite to the open end of the U-shaped cross-section and wherein the open end forms the slot.

11. The acoustic transducer of claim 7, wherein the permanent magnets are made of a rare earth alloy.

12. The acoustic transducer of claim 11, wherein the outer shell is formed of laminated sections arranged normally to the elongated direction of the transducer.

13. The acoustic transducer of claim 12, wherein the cylindrical shell has a specific length in its axial direction and the slot extends for the entire specific length.

14. The acoustic transducer of claim 13, wherein the permanent magnet means extends for at least a portion of the specific length.

15. An acoustic transducer comprising:

an elongated outer shell made of magnetic material and having a U-shaped cross-section normal to the elongated direction with opposed sides and a closed end for allowing the opposed sides to oscillate flexurally from the closed end; and magnetic drive means located within the shell and engaging the opposed sides for causing the sides to oscillate flexurally, wherein the magnetic drive means includes a permanent magnet means for forming a static magnetic field which passes through the opposed sides and normal to the elongated direction of the shell and field coil means for introducing alternating magnetic flux into the static magnetic field of the permanent magnet means.

16. The transducer of claim 15, wherein the magnetic drive means are affixed to the closed end of the U-shape.

17. The acoustic transducer of claim 16, wherein the permanent magnet means are made with a rare earth alloy.

18. The acoustic transducer of claim 17, wherein the outer shell is formed of laminated sections arranged normally to the elongated direction of the transducer.

19. The transducer of claim 16, further comprising:

a second outer shell substantially identical to the first said outer shell and having an open end which is located to oppose and substantially close a substantially identical open end of the first said shell forming a pair of opposing slots in the elongated direction of the transducer; and second magnetic drive means located within the second shell and engaging the opposed sides thereof for causing the opposed sides to oscillate flexurally.

20. The transducer of claim 19, further comprising a flexible covering effectively closing the opposing slots formed between the first said and second outer shells.

21. The transducer of claim 19, further comprising a support means extending between the closed ends of the U-shaped cross-sections of the opposed outer shells for effectively preventing vibrational modes other than a first vibrational mode from forming in the shells.

* * * * *